US009734264B2

(12) United States Patent
Iverson et al.

(10) Patent No.: US 9,734,264 B2
(45) Date of Patent: Aug. 15, 2017

(54) FABRICATING THREE-DIMENSIONAL OBJECTS WITH EMBOSSING

(71) Applicant: Microsoft Corporation, Redmond, WA (US)

(72) Inventors: Kristofer N. Iverson, Redmond, WA (US); Vladimír Šišolák, Bratislava (SK); Ján Jakubovič, Bratislava (SK); Martin Kušnier, Martin (SK); Anton Mateasik, Bratislava (SK); Milos Bazelides, Dubnica Nad Vahom (SK); Jesse McGatha, Sammamish, WA (US); Yulin Jin, Redmond, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 549 days.

(21) Appl. No.: 14/463,853

(22) Filed: Aug. 20, 2014

(65) Prior Publication Data
US 2015/0317412 A1 Nov. 5, 2015

Related U.S. Application Data

(60) Provisional application No. 61/988,789, filed on May 5, 2014.

(51) Int. Cl.
*G06T 19/20* (2011.01)
*G06F 17/50* (2006.01)
(Continued)

(52) U.S. Cl.
CPC .......... *G06F 17/50* (2013.01); *B29C 67/0088* (2013.01); *G06T 17/205* (2013.01);
(Continued)

(58) Field of Classification Search
None
See application file for complete search history.

(56) References Cited

U.S. PATENT DOCUMENTS 6,608,627 B1* 8/2003 Marshall .................. G06T 15/02
345/619
6,999,073 B1* 2/2006 Zwern .................... G06T 17/005
345/420

(Continued)

FOREIGN PATENT DOCUMENTS

JP  2007293550 A  4/2006
WO 2011/106672 A1  9/2011

OTHER PUBLICATIONS

Antonopoulos, et al., "An Interactive Tool Suite for Embossing 2D Images", In Proceedings of 5th International Conference on Signal-Image Technology & Internet-Based Systems, Nov. 29, 2009, pp. 207-214.

(Continued)

*Primary Examiner* — Isaac T Tecklu
(74) *Attorney, Agent, or Firm* — International IP Law Group, PLLC

(57) ABSTRACT

The claimed subject matter includes techniques for designing three-dimensional (3D) objects for fabrication. An example method includes obtaining a three-dimensional (3D) mesh comprising polygons and obtaining a two-dimensional (2D) image. The method also includes receiving position information describing a location of the 2D image relative to the 3D mesh and modifying the 3D mesh based on the 2D image and the position information to generate an embossed 3D mesh that is embossed with the 2D image.

26 Claims, 4 Drawing Sheets

(51) Int. Cl.
  *B29C 67/00* (2017.01)
  *G06T 17/20* (2006.01)
  *B33Y 50/02* (2015.01)
(52) U.S. Cl.
  CPC ............... *G06T 19/20* (2013.01); *B33Y 50/02* (2014.12); *G06T 2219/2021* (2013.01)

(56) References Cited

U.S. PATENT DOCUMENTS

| | | | | |
|---|---|---|---|---|
| 7,739,623 | B2* | 6/2010 | Liang | G06T 19/00 |
| | | | | 382/128 |
| 8,289,318 | B1* | 10/2012 | Hadap | G06T 17/20 |
| | | | | 345/419 |
| 9,196,090 | B2* | 11/2015 | Maisonneuve | G06T 17/205 |
| 2002/0085014 | A1* | 7/2002 | Yuda | G06T 15/005 |
| | | | | 345/582 |
| 2003/0191554 | A1* | 10/2003 | Russell | G06T 17/20 |
| | | | | 700/187 |
| 2005/0128210 | A1* | 6/2005 | Berger | G06T 15/04 |
| | | | | 345/582 |
| 2006/0067573 | A1* | 3/2006 | Parr | G06K 9/00275 |
| | | | | 382/154 |
| 2009/0006039 | A1* | 1/2009 | Watanabe | G06F 17/50 |
| | | | | 703/1 |
| 2009/0040224 | A1* | 2/2009 | Igarashi | G06T 19/00 |
| | | | | 345/427 |
| 2010/0194768 | A1* | 8/2010 | Schrag | G06T 19/00 |
| | | | | 345/584 |
| 2010/0231582 | A1* | 9/2010 | Turun | G06T 13/00 |
| | | | | 345/419 |
| 2010/0274375 | A1* | 10/2010 | Daum | G05B 19/4097 |
| | | | | 700/98 |
| 2011/0222757 | A1* | 9/2011 | Yeatman, Jr. | H04N 13/026 |
| | | | | 382/154 |
| 2011/0254839 | A1* | 10/2011 | Hammer | G06T 17/00 |
| | | | | 345/420 |
| 2013/0162633 | A1* | 6/2013 | Berger | G06T 15/04 |
| | | | | 345/419 |
| 2014/0092439 | A1* | 4/2014 | Krig | G06T 9/001 |
| | | | | 358/2.1 |
| 2014/0176535 | A1* | 6/2014 | Krig | G06T 15/04 |
| | | | | 345/419 |
| 2015/0224716 | A1* | 8/2015 | Hemani | B29C 67/0088 |
| | | | | 700/98 |
| 2015/0246488 | A1* | 9/2015 | Boettcher | G06T 11/203 |
| | | | | 264/40.1 |
| 2016/0171765 | A1* | 6/2016 | Mehr | G06F 17/11 |
| | | | | 345/419 |

OTHER PUBLICATIONS

Chung, Wil, "Emboss and Impress Images onto a Surface in OpenSCAD", Published on: Nov. 25, 2013, Available at: http://blog.cubehero.com/2013/11/25/emboss-and-impress-images-onto-a-surface-in-openscad/.

Liu, et al., "Segmenting Reliefs on Triangle Meshes", In Proceedings of ACM Symposium on Solid and Physical Modeling, Jun. 6, 2006, 10 pages.

Authur Unknown, "3D Builder", Published by Microsoft Corporation, Retrieved on: May 16, 2014, Available at: http://apps.microsoft.com/windows/en-in/app/3d-builder/75f3f766-13b3-45e9-a62f-29590d5781f2

Authur Unknown, "Adobe Photoshop CS6 for Photographers Help Guide", Published on: Nov. 28, 2012, Available at: http://www.photoshopforphotographers.com/3101-1901/Help_guide/layerstyle.html.

Authur Unknown, "Aspire Features", Published on: Oct. 3, 2013, Available at: http://www.vectric.com/products/aspire/features.htm#emboss.

Authur Unknown, "Embossing of Text and Graphics for 3D Printing", Published on: Apr. 19, 2013, Available at: http://rjwoodhead.blogspot.in/2013/04/embossing-of-text-and-graphics-for-3d.html.

Authur Unknown, "Extracting Contour Lines from Mesh", Published on: Oct. 11, 2011, Available at: http://www.davidmaudlin.com/ArchiCAD/DigitalArchitecture/Extra/Tips/MeshContours/MeshContours.html.

Authur Unknown, "Ucancam V9 Engraving Software (Standard Version)", Published on: Jul. 1, 2013, Available at: http://www.ucancam.com/3dengraving.asp.

Authur Unknown, "VRMesh 3.0—Overview", Published on: Jul. 19, 2006, Available at: http://www.dirdim.com/pdfs/DDI_VirtualGrid_VRMesh.pdf.

International Application No. PCT/US2015/029000, Written Opinion of the International Searching Authority, date of Issue Jul. 13, 2015 (11 pages).

* cited by examiner

FABRICATING THREE-DIMENSIONAL OBJECTS WITH EMBOSSING

CROSS-REFERENCE TO RELATED APPLICATION

The present application claims the benefit of U.S. Provisional Patent Application Ser. No. 61/988,789 by Sisolak et al., which is entitled "Fabricating Three-Dimensional Objects With Embossing" and was filed May 5, 2014, the disclosure of which is incorporated herein by this reference as though fully set forth herein.

BACKGROUND

Three-dimensional (3D) objects may be fabricated in various ways, including printing and additive manufacturing processes, such as fused deposition modeling. A 3D printer, for example, can create various 3D objects based on a digital representation of the object, referred to herein as a 3D model. The 3D model can be generated using a computer aided design (CAD) system or a 3D scanner, for example. In some cases, it may be desired to manipulate the 3D model to add additional features, such as text. To do this, a new 3D model can be generated for the text, and the new 3D model can be added to or subtracted from the original 3D model in discrete operations. This approach can be slow, tedious, and resource intensive. This also involves training and familiarity with the CAD application, and this skill is often out of reach of most people.

SUMMARY

The following presents a simplified summary of the innovation in order to provide a basic understanding of some aspects described herein. This summary is not an extensive overview of the claimed subject matter. It is intended to neither identify key elements of the claimed subject matter nor delineate the scope of the claimed subject matter. Its sole purpose is to present some concepts of the claimed subject matter in a simplified form as a prelude to the more detailed description that is presented later.

An implementation provides a method for designing three-dimensional (3D) objects for fabrication. The example method includes obtaining a three-dimensional (3D) mesh comprising polygons and obtaining a two-dimensional (2D) image. The method also includes receiving position information describing a position of the 2D image relative to the 3D mesh and modifying the 3D mesh based on the 2D image and the position information to generate an embossed 3D mesh that is embossed with the 2D image.

Another implementation provides a system for generating a 3D model for fabrication. The system includes a processor and a system memory that stores code to direct the operations of the processor. The code directs the processor to obtain a three-dimensional (3D) mesh comprising polygons. The code also directs the processor to obtain a two-dimensional (2D) image. The code also directs the processor to receive position information describing a position of the 2D image relative to the 3D mesh and modify the 3D mesh based on the 2D image and the position information to generate an embossed 3D mesh that is embossed with the 2D image.

Another implementation provides one or more computer-readable memory storage devices for storing computer-readable instructions that, when executed by one or more processing devices, generate an embossed 3D model. The computer-readable instructions include code configured to obtain a three-dimensional (3D) mesh of polygons and code configured to obtain a two-dimensional (2D) image. The computer-readable instructions also include code configured to receive position information describing a position of the 2D image relative to the 3D mesh and modify the 3D mesh based on the 2D image and the position information to generate an embossed 3D mesh that is embossed with the 2D image.

The following description and the annexed drawings set forth in detail certain illustrative aspects of the claimed subject matter. These aspects are indicative, however, of a few of the various ways in which the principles of the innovation may be employed and the claimed subject matter is intended to include all such aspects and their equivalents. Other advantages and novel features of the claimed subject matter will become apparent from the following detailed description of the innovation when considered in conjunction with the drawings.

DETAILED DESCRIPTION

Figure 1:
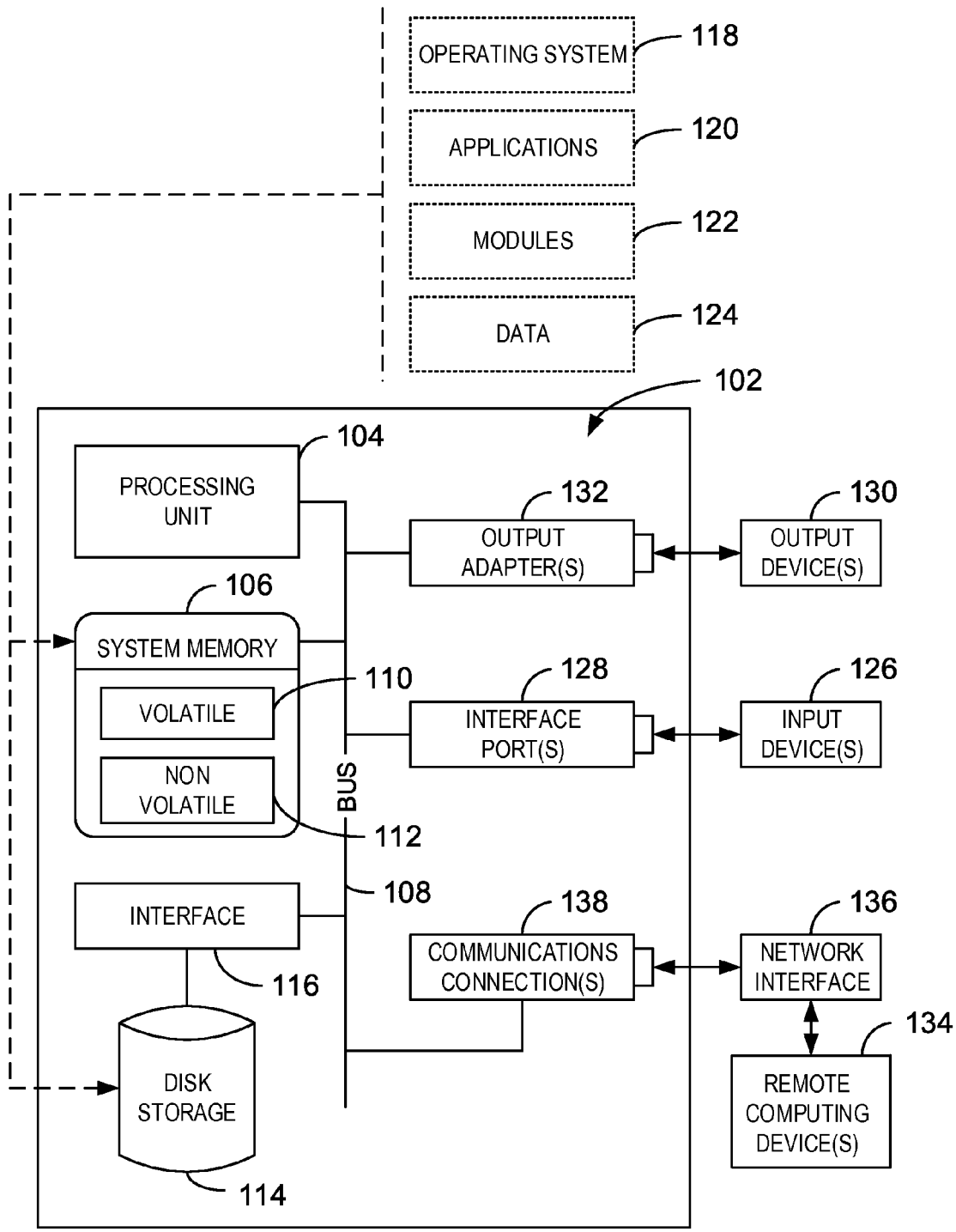
FIG. 1 is a block diagram of an example operating environment configured for implementing various aspects of the techniques described herein.

As a preliminary matter, some of the figures describe concepts in the context of one or more structural components, variously referred to as functionality, modules, features, elements, or the like. The various components shown in the figures can be implemented in any manner, such as software, hardware, firmware, or combinations thereof. In some cases, various components shown in the figures may reflect the use of corresponding components in an actual implementation. In other cases, any single component illustrated in the figures may be implemented by a number of actual components. The depiction of any two or more separate components in the figures may reflect different functions performed by a single actual component. FIG. 1, discussed below, provides details regarding one system that may be used to implement the functions shown in the figures.

Other figures describe the concepts in flowchart form. In this form, certain operations are described as constituting distinct blocks performed in a certain order. Such implementations are exemplary and non-limiting. Certain blocks described herein can be grouped together and performed in a single operation, certain blocks can be broken apart into multiple component blocks, and certain blocks can be performed in an order that differs from that which is illustrated herein, including a parallel manner of performing the blocks. The blocks shown in the flowcharts can be implemented by software, hardware, firmware, manual processing, or the like. As used herein, hardware may include computer systems, discrete logic components, such as application specific integrated circuits (ASICs), or the like.

As to terminology, the phrase "configured to" encompasses any way that any kind of functionality can be constructed to perform an identified operation. The functionality can be configured to perform an operation using, for instance, software, hardware, firmware, or the like. The term, "logic" encompasses any functionality for performing a task. For instance, each operation illustrated in the flowcharts corresponds to logic for performing that operation. An operation can be performed using, software, hardware, firmware, or the like. The terms, "component," "system," and the like may refer to computer-related entities, hardware, and software in execution, firmware, or combination thereof. A component may be a process running on a processor, an object, an executable, a program, a function, a subroutine, a computer, or a combination of software and hardware. The term, "processor," may refer to a hardware component, such as a processing unit of a computer system.

Furthermore, the claimed subject matter may be implemented as a method, apparatus, or article of manufacture using standard programming and engineering techniques to produce software, firmware, hardware, or any combination thereof to control a computing device to implement the disclosed subject matter. The term, "article of manufacture," as used herein is intended to encompass a computer program accessible from any computer-readable storage device or media. Computer-readable storage media can include, but are not limited to, magnetic storage devices, e.g., hard disk, floppy disk, magnetic strips, optical disk, compact disk (CD), digital versatile disk (DVD), smart cards, flash memory devices, among others. In contrast, computer-readable media, i.e., not storage media, may include communication media such as transmission media for wireless signals and the like.

The following describes example implementations of techniques for generating a 3D model with embossing. The 3D model may be a type of model referred to as a mesh model, which includes a mesh of polygons defined by vertices connected by edges. The mesh can be a mesh of triangles. However, any suitable shape can be used to generate the mesh model. The present techniques enable a user to emboss an image on the surface of the 3D model by directly manipulating the 3D model. As used herein, the term "embossing" refers to creating a raised or depressed surface on a 3D object or 3D model. To add embossing, the 3D model can be altered by superimposing a two-dimensional (2D) image onto the 3D model, which eliminates the process of generating a 3D model for the embossed image and combining the 3D models. In this way, the 3D model is manipulated more simply, which makes it easier for the user to personalize an existing 3D model. The 3D model or 3D mesh to be embossed may be referred to herein as the "initial" 3D model or 3D mesh, and the 3D model after the embossing process is referred to herein as the "embossed" 3D model or 3D mesh. Techniques for generating an embossed 3D model are described more fully in relation to the Figures below.

FIG. 1 is intended to provide a brief, general description of a computing environment in which the various techniques described herein may be implemented. For example, a method and system for generating a 3D model to be used for fabricating 3D objects can be implemented in such a computing environment. While the claimed subject matter has been described above in the general context of computer-executable instructions of a computer program that runs on a local computer or remote computer, the claimed subject matter also may be implemented in combination with other program modules. Generally, program modules include routines, programs, components, data structures, or the like that perform particular tasks or implement particular abstract data types.

FIG. 1 is a block diagram of an example operating environment configured for implementing various aspects of the techniques described herein. The example operating environment 100 includes a computer 102. The computer 102 includes a processing unit 104, a system memory 106, and a system bus 108.

The system bus 108 couples system components including, but not limited to, the system memory 106 to the processing unit 104. The processing unit 104 can be any of various available processors. Dual microprocessors and other multiprocessor architectures also can be employed as the processing unit 104.

The system bus 108 can be any of several types of bus structure, including the memory bus or memory controller, a peripheral bus or external bus, and a local bus using any variety of available bus architectures known to those of ordinary skill in the art. The system memory 106 includes computer-readable storage media that includes volatile memory 110 and nonvolatile memory 112.

The basic input/output system (BIOS), containing the basic routines to transfer information between elements within the computer 102, such as during start-up, is stored in nonvolatile memory 112. By way of illustration, and not limitation, nonvolatile memory 112 can include read-only memory (ROM), programmable ROM (PROM), electrically programmable ROM (EPROM), electrically erasable programmable ROM (EEPROM), or flash memory.

Volatile memory 110 includes random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), SynchLink™ DRAM (SLDRAM), Rambus® direct RAM (RDRAM), direct Rambus® dynamic RAM (DRDRAM), and Rambus® dynamic RAM (RDRAM).

The computer 102 also includes other computer-readable media, such as removable/non-removable, volatile/non-volatile computer storage media. FIG. 1 shows, for example a disk storage 114. Disk storage 114 includes, but is not limited to, devices like a magnetic disk drive, floppy disk drive, tape drive, Jaz drive, Zip drive, LS-210 drive, flash memory card, or memory stick.

In addition, disk storage 114 can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 114 to the system bus 108, a removable or non-removable interface is typically used such as interface 116.

It is to be appreciated that FIG. 1 describes software that acts as an intermediary between users and the basic computer resources described in the suitable operating environment 100. Such software includes an operating system 118. Operating system 118, which can be stored on disk storage 114, acts to control and allocate resources of the computer 102.

System applications 120 take advantage of the management of resources by operating system 118 through program modules 122 and program data 124 stored either in system memory 106 or on disk storage 114. It is to be appreciated that the claimed subject matter can be implemented with various operating systems or combinations of operating systems.

A user enters commands or information into the computer 102 through input devices 126. Input devices 126 include, but are not limited to, a pointing device, such as, a mouse, trackball, stylus, and the like, a keyboard, a microphone, a joystick, a satellite dish, a scanner, a TV tuner card, a digital camera, a digital video camera, a web camera, and the like. The input devices 126 connect to the processing unit 104 through the system bus 108 via interface ports 128. Interface ports 128 include, for example, a serial port, a parallel port, a game port, and a universal serial bus (USB).

Output devices 130 use some of the same type of ports as input devices 126. Thus, for example, a USB port may be used to provide input to the computer 102, and to output information from computer 102 to an output device 130.

Output adapter 132 is provided to illustrate that there are some output devices 130 like monitors, speakers, and printers, among other output devices 130, which are accessible via adapters. The output adapters 132 include, by way of illustration and not limitation, video and sound cards that provide a means of connection between the output device 130 and the system bus 108. It can be noted that other devices and systems of devices can provide both input and output capabilities such as remote computers 134.

The computer 102 can be a server hosting various software applications in a networked environment using logical connections to one or more remote computers, such as remote computers 134. The remote computers 134 may be client systems configured with web browsers, PC applications, mobile phone applications, and the like.

The remote computers 134 can be a personal computer, a server, a router, a network PC, a workstation, a microprocessor based appliance, a mobile phone, a peer device or other common network node and the like, and typically includes many or all of the elements described relative to the computer 102.

Remote computers 134 can be logically connected to the computer 102 through a network interface 136 and then connected via a communication connection 138, which may be wireless.

Network interface 136 encompasses wireless communication networks such as local-area networks (LAN) and wide-area networks (WAN). LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection 138 refers to the hardware/software employed to connect the network interface 136 to the bus 108. While communication connection 138 is shown for illustrative clarity inside computer 102, it can also be external to the computer 102. The hardware/software for connection to the network interface 136 may include, for exemplary purposes, internal and external technologies such as, mobile phone switches, modems including regular telephone grade modems, cable modems and DSL modems, ISDN adapters, and Ethernet cards.

An example processing unit 104 for the server may be a computing cluster. The disk storage 114 may comprise an enterprise data storage system, for example, holding thousands of impressions.

The computer 102 can be configured to generate an embossed 3D model. The data 124 may include one or more initial 3D models, which may be obtained from a portable storage device or downloaded from a remote computer or via the internet, for example. For example, the 3D model may be a model of a trophy, plaque, or any other suitable object. In some examples, the 3D model is a mesh model.

One or more of applications 120 may be configured to enable a user to select an initial 3D model and emboss the initial 3D model. For example, the user may want to emboss a person's name on the 3D model. The application 120 may provide a Graphical User Interface (GUI) that enables a user to customize the initial 3D model by adding text. Through the GUI, the user may input the text that the user wants to place on the object. The user can also specify a font, a font size, a language, and the like. The text may be superimposed over the 3D model as a 2-dimensional (2D) image. The 2D image may be treated as a binary image, having two discrete values for each pixel. Based on these user inputs, the computer 102 can compute an embossed 3D model based on the initial 3D model and the 2D image of the text.

In addition to text, the one or more applications 120 can also enable the user to emboss any suitable type of image on the 3D model. For example, the image may be a portion of a texture that can be repeated over a surface of the 3D model. For example, the texture image can include a pattern of solid and high-contrast areas, such as a black-and-white pattern. Examples of such textures include clear contours and cartoon-like images with solid and high contrast areas. Clear contours are distinct, non-jittering with smooth edges and no gradients. The techniques described herein enable the image to be repeated over the entire 3D model in one automated step. Thus, complex and detailed textures can be added to a 3D model much more easily compared to a user directly adjusting the entire surface the 3D model in several small discrete manipulations of the 3D model.

The data 124 may include one or more 2D images, which may be obtained from a portable storage device or downloaded from a remote computer or via the internet, for example. The user can select one or more of the 2D images for embossing the initial 3D model.

In some examples, the user can also control the placement of the embossing on the initial 3D model, including the location and orientation. The user can control the placement of the 2D embossing image on the 3D model by defining a projection surface via the GUI. The projection surface is a geometric surface over which the 2D image will be superimposed to determine how to alter the 3D model. The projection surface may be a simple geometric shape such as a plane, sphere, or cylinder, among others. The user can select a type of projection surface that more closely corresponds with the surface to be embossed, such as a different geometric shape, for example. For example, if the surface to be embossed is a plaque, the user may select a planar projection surface. If the surface to be embossed is a globe, the user may select a spherical projection surface. The user may also control the position, size, and orientation of the image on the projection surface. The user may also specify an extrusion parameter, which specifies a depth or height of the embossing, i.e., the depth that the 2D image is impressed into the 3D model, or the height that the 2D image projects from the 3D model.

After selecting a type of projection surface, positioning the projection surface, and positioning the emboss image on the projection surface, the user can instruct the computer 102 to generate the embossed 3D model. Using all of the inputs provided, the computer 102 computes the embossed 3D model by extruding the portions of the 3D model that correspond with the 2D image. The user may then store the embossed 3D model, for example to disk storage 114, or send the embossed 3D model to a fabricator, such as the fabricator 200 describe below in relation to FIG. 2. The computations executed by the computer 102 to generate the embossed 3D model are described further below in relation to FIG. 3.

In some examples, some or all of the processes performed for generating the embossed mesh can be performed in a cloud service and reloaded on the client computer of the user. For example, some or all of the applications described above for embossing the 3D model could be running in a cloud service and receiving input from a user through a client computer. Thus, the calculations involved in computing the embossed 3D model could be performed on a cloud computing system.

Figure 2:
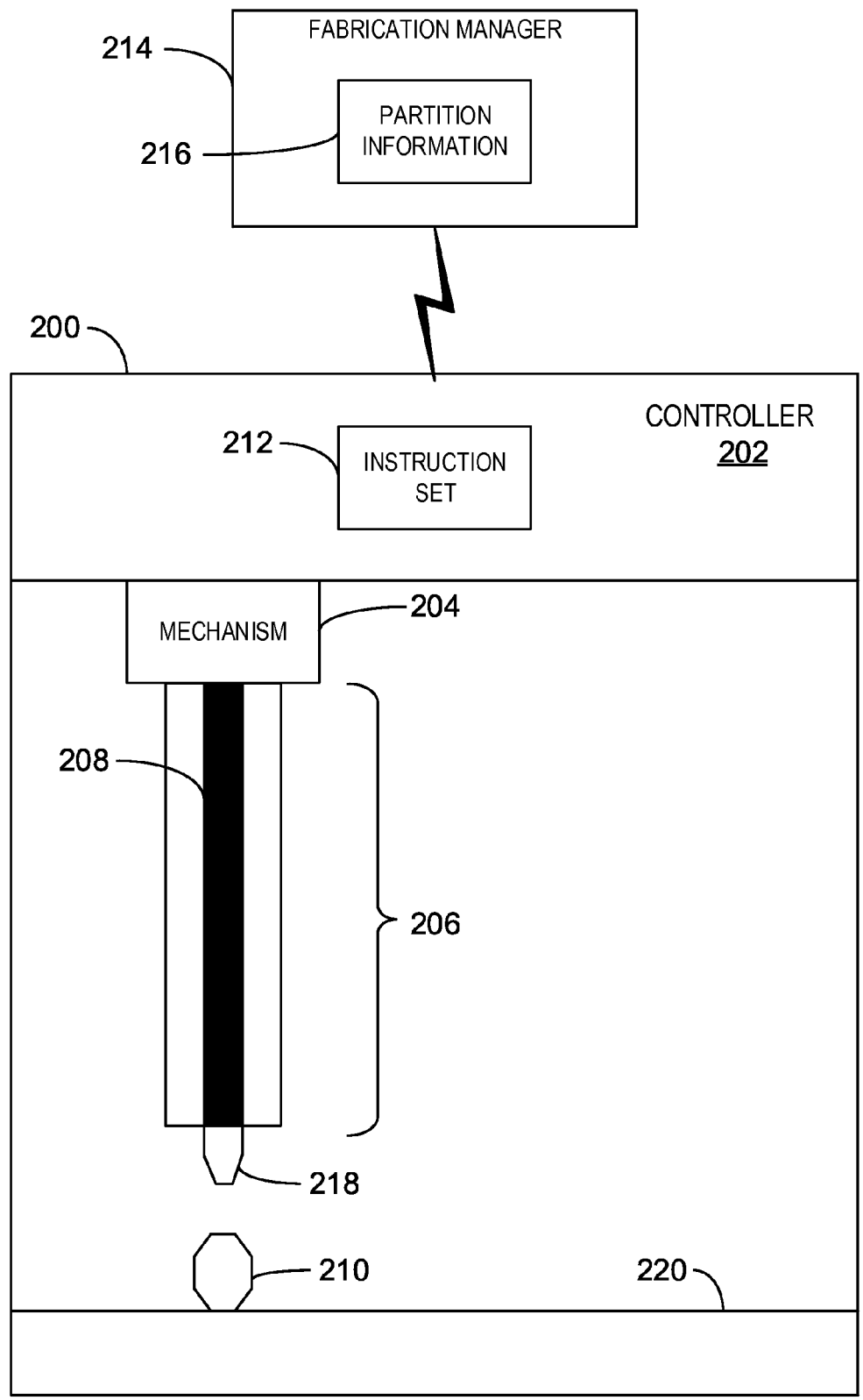
FIG. 2 is a block diagram of an example fabricator for fabricating a 3D object using on a 3D model.

FIG. 2 is a block diagram of an example fabricator for fabricating a 3D object using on a 3D model. The fabricator 200 may include a control unit or controller 202 coupled to a first mechanism 204 and configured to execute instructions for the first mechanism 204 and a second mechanism 206. A chamber 208 constructed within the second mechanism 206 allows materials to be prepared, e.g., heated and blended, when fabricating an object 210. For example, the chamber 208 is used for melting and extruding filaments or other compatible materials.

The first mechanism 204 may be referred to as a robotic mechanism, e.g., a gantry robot, including various mechanical or electro-mechanical components. By executing at least some instructions within an instruction set 212, the first mechanism 204 may actuate these components into performing at least some physical movement. The fabrication manager 214 may generate the instruction set 212 by partitioning a 3D model, including an embossed 3D model, into layers and providing specific fabrication instructions for each layer. When actuated, these components may move horizontally, vertically, diagonally, rotationally, and so forth. One example implementation of the first mechanism 204 moves a printing mechanism or tool across an x, y, or z-axis in order to deposit material at a specific position within the object 210 being fabricated.

The second mechanism 206 may be referred to as a printing mechanism that includes one or more printing tool heads. The material may be pushed or pulled into a printing tool head, and the motors may be mounted further away in order to push the material through a thin guide tube into the chamber 208. Although the second mechanism 206 may resemble an extruder configuration, e.g., a single extruder head configuration, it is appreciated that the second mechanism 206 represents any compatible technology, including legacy printing tool heads configured to deposit various types of materials.

The instructions mentioned above, which are stored in an instruction set 212, may be collectively referred to as coordinated instructions because such instructions are executed, in coordination with multiple components. For example, instructions for different stepper motors in an extruder configuration may be coordinated such that an appropriate extrudable material is fed into the chamber 208. Accordingly, an instruction for one stepper motor may be synchronized in time with an instruction for another stepper motor such that both stepper motors can operate in coordination with each other.

The fabrication manager 214 may include hardware and software components operating on various implementations of computing devices, such as a remote computing device and an attached computing device. One example implementation of the fabrication manager 214 processes a 3D model corresponding to an object being fabricated and partitions that information into layers in which each layer includes at least some geometry, which may include geometric elements corresponding to a surface mesh. The present disclosure may use "partition", "slice", or another similar term in place of "layer," and it is appreciated that these terms be defined as interchangeable.

Within partition information 216, the fabrication manager 214 stores a data structure corresponding to the 3D model. Geometry generally refers to a set of geometric elements, such as a 3D polyhedron or other shape, which may represent an amount of extrudable material to be deposited. One example measure represents at least a portion of the geometry—and therefore, the amount of extrudable material—volumetrically. The example measure may define a portion of the geometry using standardized units in which each unit represents a minimal amount, e.g., volume, of colored material at a given time instance, such as by an extrusion width. Each geographic element may include one or more standardized units.

The fabrication manager 214 is configured to generate instructions that, when executed by the controller 202, actuate components of the first mechanism 204, which may result in movements of the second mechanism 206 following a surface geometry, e.g., an exterior shell of the object 210. Optionally, a movable platform, such as a platform 220, functions as a mechanism for printing the object 210. The first mechanism 204 may operate the platform 220 to guide the object 210 and the nozzle 218 to each other. The instruction set 212 may include instructions for automatically calibrating the platform 220 such that through a series of movements in an x, y, and z direction or in rotation across an x-y plane, the 3D object 210 is moved to a correct position for the nozzle 218 to deposit material.

Some example implementations of the fabricator 200 include legacy devices that are retrofitted with at least some of the components described herein, including the controller 202, the fabrication manager 214, and a printing tool head, such as the second mechanism 206. As one option, the fabricator 200 may include an additional microprocessor to manage the set of motors and to receive a signal from an original microprocessor when a command is processed.

To illustrate one example, a verified manifold object, represented in a 3D mesh model, may be partitioned into layers by processing each polygon representing the object, and projecting each polygon through a slicing plane. This projection generates a point and connections to other points in a manner that eventually creates a path. From this point, the path is reduced to units, e.g., volumetric measures of geometric elements, representing addressable units for a specific hardware characteristic of a corresponding fabricator. The units may not be the same size, axis aligned, and the same size in each dimension. One example implementation may utilize non-cubic units of different sizes along an x, y, or z axis, which enables different effective resolutions per dimension. According to an example implementation, the partition information 216 may include voxelized data such that each addressable (voxel) unit includes a variety of information, such as color, texture, and lighting values, for geometry within that addressable voxel unit.

An example fabricator 200 includes an arrangement of motors and a tool head having a mixing chamber and a nozzle. The tool head also may include a heating element for melting extrudable material to a prescribed temperature. When fabricating the 3D object, the fabrication manager 214 determines an approximate amount of extrudable material capable of being deposited at a given (x, y, z) location. The fabrication manager 214 uses the determined amount to define addressable units on the object's shell. Each unit represents a specific geometric element or a portion of the 3D object. The addressable units may be represented herein as voxelized data, e.g., voxelized data structure. In an example implementation, the fabrication manager 214 determines volume in voxel units, e.g., volumetric pixels. The fabricator's 3D space is factored by a minimum volume of extrudable material. Other information may include implicit values, such as, distance to an object surface mesh, probabilities indicating whether a voxel unit of the object occupies the volume represented. This technique may be applied to the object's entire volume, including the outer shell.

Figure 3:
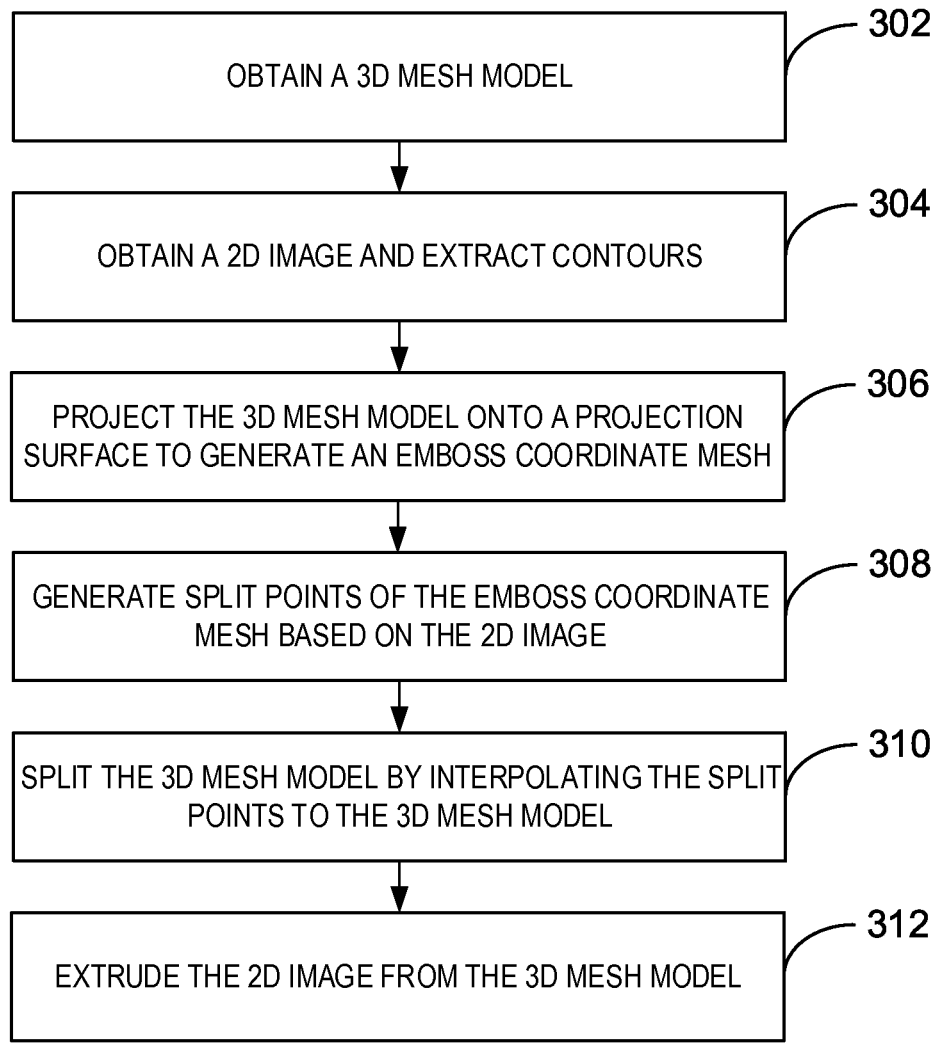
FIG. 3 is a process flow diagram of a method of generating a 3D model for fabrication.

FIG. 3 is a process flow diagram of a method of generating a 3D model for fabrication. One or more components of hardware or software of the operating environment 100, may be configured to perform the method 300. In some examples, various aspects of the method may be performed in a cloud computing system. The method 300 may begin at block 302.

At block 302 a 3D model is obtained. For example, the 3D model may be selected by a user and retrieved from a storage device, a remote computer, or over the Internet. The 3D model may be a mesh model that includes a mesh of polygons such as triangles.

At block 304, a 2D image is obtained and contours of the 2D image may be extracted. The 2D image may be selected by a user and retrieved from a storage device, a remote computer, or over the Internet, for example. The 2D image may also be generated based on a user entry of text and selection of font characteristics, such as font size, font type, and the like. The 2D image may a bitmap, in which case, the bitmap is processed to extract the contours that will be used to emboss the 3D model. Contours are represented as polygons and may contain holes. The interiors of the polygons represent those areas that will be extruded from the mesh and correspond with portions of the bitmap that are solid.

Extracting contours includes generating 2D vector coordinates that represent the outline of the solid portions of the 2D bitmap image. Any suitable technique can be used to extract the contours. In one example, the bitmap is first processed so that each pixel is defined as solid or empty. For example, if the bitmap is black and white, black pixels can be treated as solid and white pixels can be treated as empty. In the case of text, bits that correspond with a portion of a letter are referred to as solid and bits that correspond with a space between letters are referred to as empty. If the bitmap is a color bitmap, the color of each pixel can be compared to a threshold to determine whether the pixel is to be treated as solid or empty.

To generate the contours, the bitmap is scanned from top-to-bottom and left-to-right, or any other suitable direction. When a solid bit is found, the bit is treated as a seed point and the bit's eight pixel neighbors are scanned in a clockwise direction until another solid bit is found. If such a bit is found, it becomes a new seed point and the current seed point is output to a collection of 2D vector coordinates. This process repeats until the original starting seed point is reached. Once the original seed point is reached, a closed edge has been found and the collected 2D vector coordinates are output to a collection of contours. The contour is a vector outline of a portion of the 2D image. In some examples, seed points are also marked as "visited" during the scan to avoid scanning the same portion of the bitmap. Once a closed edge is output, the bitmap is scanned again to find another unvisited seed point and the process repeats. The contours contained within a closed edge, such as holes within a letter, may be identified using a similar process. For example, once a closed edge is found, the interior of the closed edge may be scanned to find empty bits. If an empty bit is found, it's eight pixel neighbors can be scanned, and the 2D vector parameters of any solid bits can be output to a collection of 2D vector coordinates of a contour.

In some examples, after identifying the contours of the bitmap, each contour is simplified to a smaller number of vector coordinates that still accurately describe the extracted contour. Any suitable algorithm can be used to simplify the closed edges, such as the Ramer-Douglas-Peucker algorithm, among others. In some examples, the technique for simplifying the contours includes scanning each contour from seed point to seed point. At the beginning of the scan, a base line defined by the first two seed points of the input contour is determined. The third seed point is then obtained and the perpendicular distance of the third seed point from the base line is calculated and compared to a threshold value. If the distance is less than the threshold value, the next seed point is obtained and the process repeated. Once a seed point is identified wherein the computed distance exceeds the threshold, that seed point and the next point in the contour become the next base line and the original point that was previously the first point of the base line is output as a part of the simplified contour. In some examples, the 2D image that is obtained is already in a vector representation, in which case, the process of extracting contours may be skipped.

At block 306, emboss coordinates are generated. Emboss coordinates are used to place the 2D image onto the surface of the 3D mesh model. Each 3D vertex of the 3D mesh has a corresponding emboss coordinate that can be mapped to a part of the 2D image. The emboss coordinates can be generated by projection. The point of projection may be a simple surface, like a plane, sphere, or cylinder, which is easily parameterized, meaning that that the 2D image can easily be mapped to the surface. The vertices of the complex 3D mesh model can be projected onto this simple projection surface to generate the emboss coordinates. In the case of a planar projection surface the vertices are projected along normal of the plane. In the case of spherical projection surface, the projection lines emanate from the center of the sphere and pass through the mesh vertices. In the case of a cylindrical projection surface, the projection lines emanate perpendicularly from the axis of the cylinder and pass through the mesh vertices. For each vertex of the 3D mesh, the parametric 2D coordinates of the intersection of the corresponding projection line with the projection surface defines the emboss coordinates for that vertex. The emboss coordinates of the 3D mesh are collectively referred to herein as the emboss-coordinate mesh. In some examples, to position the image onto the mesh, the user is given control of the position, rotation, and size of the projection surface. The user also determines the position, rotation, and size of the 2D image on the projection surface. Based on the placement of the projection surface and the 2D image, the points of the 2D image and the emboss coordinates of the 3D mesh can be mapped to the same 2D coordinate space.

In some examples, the method includes automatically ensuring that overlapping portions of the 3D mesh model are not covered by the same projected image, such as could happen in the case of a concave mesh. This can be achieved by starting the projection in a mesh polygon corresponding to a center point of the image and spreading to adjacent polygons. Spreading in the current direction stops when the current polygon is back facing the projection line.

Before the 2D image can be extruded from the surface of the 3D mesh, the polygons of the 3D mesh are split by contour lines of the 2D image. To simplify the splitting process, the splitting can be executed in the 2D space of the projection plane, since each 3D polygon of the 3D mesh has a corresponding 2D triangle given by emboss coordinates at its vertices. Splitting the 3D mesh is described below in relation to blocks 308 and 310.

At block 308, split points are generated for the emboss-coordinate mesh. A split point is generated at any point where a contour line of the 2D image passes through an edge of one of the 2D polygons of the 2D emboss-coordinate mesh. Each polygon will be split by each contour line segment that passes through it. To reduce the computational complexity involved in generating the split points, bounding rectangle tests can be used to skip the combinations of polygons and contour line segments that do not intersect.

At block 310, the 3D mesh is split by interpolating the split points identified at block 308 to corresponding locations of the 3D mesh. Each split point becomes a vertex of a new polygon, and additional vertices may also be added to generate new polygons, such that no edge of any of the polygons crosses a contour line of the 2D image. Accordingly, each polygon of the mesh will correspond to an interior portion of the 2D image or an exterior portion of the 2D image, but not both.

At block 312, the 2D image is extruded from the 3D mesh model. To extrude the 2D image, the polygons of the split 3D mesh that correspond to the interior of the 2D image are shifted. Shifting the polygons can include lifting the polygons from the surface of the 3D mesh so that the 3D image projects from the surface of the 3D model. Shifting the polygons can include depressing the polygons into the surface of the 3D mesh so that the 3D image sinks into the surface of the 3D model. To shift the polygons, the vertices of each polygon can be shifted by an equal amount in a direction normal to the projection surface. The direction of the shift can be along a projection line or in a direction normal to the projection surface. For a planar projection surface, the vertices of each polygon can be shifted by an equal amount in the same direction. For a non-planar projection surface, such as a spherical projection surface, the vertices of each polygon can be shifted by an equal amount in a direction away from the center of the sphere. After shifting the polygons, additional polygons are added to represent the side walls of the projection or depression in the 3D mesh.

To account for the holes in the 2D image, contour loops that correspond to interior areas can be extruded in one direction and contour loops that correspond to holes can be extruded in the opposite direction. The end effect will be the same regardless of the order in which the contour loops are extruded.

This process flow diagram is not intended to indicate that the blocks of the method 300 are to be executed in any particular order, or that all of the blocks are to be included in every case. Further, any number of additional blocks not shown may be included within the method 300, depending on the details of the specific implementation.

Figure 4:
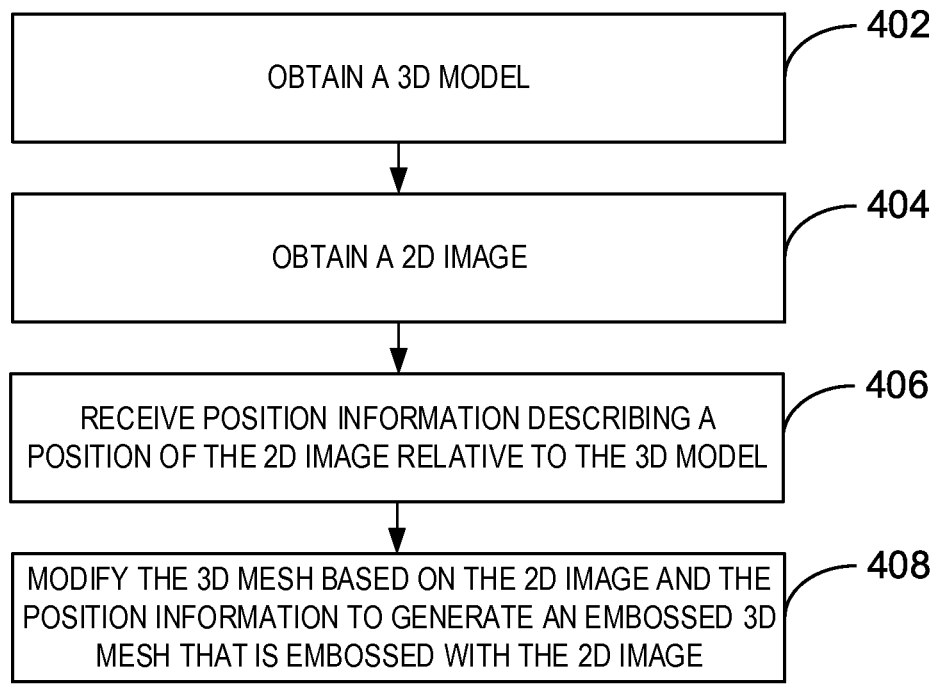
FIG. 4 is a process flow diagram summarizing a method of generating a 3D model for fabrication.

FIG. 4 is a process flow diagram summarizing a method of generating a 3D model for fabrication. One or more components of hardware or software of the operating environment 100, may be configured to perform the method 400. In some examples, various aspects of the method may be performed in a cloud computing system. The method 400 may begin at block 402.

At block 402 a 3D model is obtained. The 3D model may be selected by a user and retrieved from a storage device, a remote computer, or over the Internet, for example. The 3D model may be a mesh model that includes a mesh of polygons such as triangles.

At block 404, a 2D image is obtained. The 2D image may be selected by a user and retrieved from a storage device, a remote computer, a camera, a smart phone, or over the Internet, for example. The 2D image may in any type of image file format including pixel-based formats such as Joint Photographic Experts Group (JPEG), Graphics Interchange Format (GIF), and Windows Bitmap (BMP) and vector-based formats such as Scalable Vector Graphics (SVG). The 2D image may also be a color image or a black-and-white image. The 2D image may also be obtained by being generated based on a user entry of text and selection of font characteristics, such as font size, font type, and the like.

At block 406, position information describing a position of the 2D image relative to the 3D model is obtained. The position information can include the relative location, size, and rotational orientation of the 2D image relative to the 3D model. In some examples, the position information is obtained from the user. For example, the user may interact with a GUI to change the location, size, and rotational orientation of the 2D image through a graphical user interface. Receiving position information from the user may also include selecting a projection surface type and controlling placement of the projection surface relative to the 3D model, as described in relation to FIG. 3. In some examples, there may be a pre-determined image placement available, and obtaining the position information can include retrieving the pre-determined position information from memory. For example, the pre-determined position information may be stored within the 2D image file or in a separate file associated with the 2D image file and/or the 3D model. The position information may also indicate whether the 2D image is to be repeated over the 3D model, for example, in the case of a 2D image that provides a surface texture.

At block 408, the 3D model is modified based on the 2D image and the position information to generate an embossed 3D model. The resulting embossed 3D model is embossed with the 2D image. In some examples, the 2D image appears on the embossed 3D model once, such as text appearing on a plaque or trophy, for example. In some examples, the 2D image is repeated over a surface of the embossed 3D model, for example, to provide a surface texture. The modification of the 3D model is accomplished in a single operation, meaning that once the 3D model, the 2D image, and the position information have been obtained, the modification of the 3D model is automatically performed by one or more processing devices without additional user involvement such as the user repositioning mesh vertices or the user generating a 3D model from the 2D image.

To create the embossed 3D model, portions of the 3D model corresponding to the internal areas of the 2D image are extruded from the 3D model. In some examples, the vertices of the extruded portions of the 3D model are all shifted by the same amount and therefore maintain the same position relative to one another. In this way, the surfaces of the embossed 3D model that correspond to the interior of the 2D image will have the same relief as the corresponding portion of the 3D model before being modified. In other words, the surface features in the embossed portions of the 3D model will be the same before and after the embossing, with no loss of detail.

This process flow diagram is not intended to indicate that the blocks of the method 400 are to be executed in any particular order, or that all of the blocks are to be included in every case. Further, any number of additional blocks not shown may be included within the method 400, depending on the details of the specific implementation.

Example 1

An example of a method for designing three-dimensional (3D) objects for fabrication is provided. The example method includes obtaining a three-dimensional (3D) mesh comprising polygons and obtaining a two-dimensional (2D) image. The method also includes receiving position information describing a position of the 2D image relative to the 3D mesh and modifying the 3D mesh based on the 2D image and the position information to generate an embossed 3D mesh that is embossed with the 2D image.

In some implementations, modifying the 3D mesh includes projecting the 3D mesh onto a projection surface to generate an emboss-coordinate mesh and generating split points of the emboss-coordinate mesh based on the 2D image. Modifying the 3D mesh can also include splitting the 3D mesh by interpolating the split points to the 3D mesh, wherein each polygon of the split 3D mesh corresponds to one of an interior of the 2D image or an exterior of the 2D image and shifting the polygons corresponding to the interior of the 2D image to generate an embossed 3D mesh.

In some implementations, the 2D image is a bitmap image and the method includes generating a vector outline of the bitmap image, wherein the vector outline is used to generate the split points of the emboss-coordinate mesh. Generating split points of the emboss-coordinate mesh can include creating a split point at any location where the vector outline of the bitmap image intersects with a polygon of the emboss-coordinate mesh.

The projection surface can be a plane and projecting the 3D mesh onto the projection surface can include projecting vertices of the 3D mesh in a direction normal to the projection surface. The projection surface can also be a cylinder and projecting the 3D mesh onto the projection surface can include projecting vertices of the 3D mesh in a line emanating perpendicularly from an axis of the cylinder. The projection surface can be a sphere and projecting the 3D mesh onto the projection surface can include projecting vertices of the 3D mesh in a line emanating from a center of the sphere. The method can include receiving a definition of the projection surface from a user, wherein the definition includes a projection surface type and location.

The method can also include fabricating a 3D object based on the embossed 3D mesh. In some implementations, a surface of the embossed 3D mesh corresponding to an interior of the 2D image has a same relief as a corresponding portion of the 3D mesh before being modified.

Example 2

Another implementation provides a system for generating a 3D model for fabrication. The example system includes a processor and a system memory that stores code to direct the operations of the processor. The code directs the processor to obtain a three-dimensional (3D) mesh comprising polygons. The code also directs the processor to obtain a two-dimensional (2D) image. The code also directs the processor to receive position information describing a position of the 2D image relative to the 3D mesh and modify the 3D mesh based on the 2D image and the position information to generate an embossed 3D mesh that is embossed with the 2D image.

In some implementations, to modify the 3D mesh the code can direct the processor to project the 3D mesh onto a projection surface to generate an emboss-coordinate mesh, generate split points of the emboss-coordinate mesh based on the 2D image, and split the 3D mesh by interpolating the split points to the 3D mesh. Each polygon of the split 3D mesh corresponds to one of an interior of the 2D image or an exterior of the 2D image. The code can direct the processor to shift the polygons corresponding to the interior of the 2D image to generate the embossed 3D mesh.

In some implementations, the 2D image is a bitmap image and the code directs the processor to generate a vector outline of the bitmap image, wherein the vector outline is used to generate the split points of the emboss-coordinate mesh. To generating split points of the emboss-coordinate mesh the code can direct the processor to create a split point at any location where the vector outline of the bitmap image intersects with a polygon of the emboss-coordinate mesh.

The projection surface can be a plane and to project the 3D mesh onto the projection surface the code can direct the processor to project vertices of the 3D mesh in a direction normal to the projection surface. The projection surface can also be a cylinder and to project the 3D mesh onto the projection surface the code can direct the processor to project vertices of the 3D mesh in a line emanating perpendicularly from an axis of the cylinder. The projection surface can be a sphere and to project the 3D mesh onto the projection surface the code can direct the processor to project vertices of the 3D mesh in a line emanating from a center of the sphere. The code can also direct the processor to generate a Graphical User Interface (GUI) that enables a user to select a projection surface type and control placement of the projection surface relative to the 3D mesh.

The code can also direct the processor to send the embossed 3D mesh to a 3D printer for fabricating a 3D object based on the embossed 3D mesh. In some implementations, a surface of the embossed 3D mesh corresponding to an interior of the 2D image has a same relief as a corresponding portion of the 3D mesh before being modified.

Example 3

Another implementation provides one or more computer-readable memory storage devices for storing computer-readable instructions that, when executed by one or more processing devices, generate an embossed 3D model. The computer-readable instructions include code configured to obtain a three-dimensional (3D) mesh of polygons and code configured to obtain a two-dimensional (2D) image. The computer-readable instructions also include code configured to receive position information describing a position of the 2D image relative to the 3D mesh and modify the 3D mesh based on the 2D image and the position information to generate an embossed 3D mesh that is embossed with the 2D image.

The computer-readable instructions also include code configured to project the 3D mesh onto a projection surface to generate an emboss-coordinate mesh. The computer-readable instructions also include code configured to generate split points of the emboss-coordinate mesh based on the 2D image. The computer-readable instructions also include code configured to split the 3D mesh by interpolating the split points to the 3D mesh, wherein each polygon of the split 3D mesh corresponds to one of an interior of the 2D image or an exterior of the 2D image. The computer-readable instructions also include code configured to shift the polygons corresponding to the interior of the 2D image to generate an embossed 3D mesh.

In some implementations, the 2D image is a bitmap image and the computer-readable instructions include code configured to generate a vector outline of the bitmap image, wherein the vector outline is used to generate the split points of the emboss-coordinate mesh. The code configured to generate split points of the emboss-coordinate mesh can be configured to create a split point at any location where the vector outline of the bitmap image intersects with a polygon of the emboss-coordinate mesh.

The memory storage device can also include code configured to provide a graphical user interface (GUI) that enables a user to select a projection surface type and control placement of the projection surface relative to the 3D mesh. In some examples, a surface of the embossed 3D mesh corresponding to an interior of the 2D image has a same relief as a corresponding portion of the 3D mesh before being modified.

What has been described above includes examples of the claimed subject matter. It is, of course, not possible to describe every conceivable combination of components or methodologies for purposes of describing the claimed subject matter, but one of ordinary skill in the art may recognize that many further combinations and permutations of the claimed subject matter are possible. Accordingly, the claimed subject matter is intended to embrace all such alterations, modifications, and variations that fall within the spirit and scope of the appended claims.

In particular and in regard to the various functions performed by the above described components, devices, circuits, systems and the like, the terms (including a reference to a "means") used to describe such components are intended to correspond, unless otherwise indicated, to any component which performs the specified function of the described component, e.g., a functional equivalent, even though not structurally equivalent to the disclosed structure, which performs the function in the herein illustrated exemplary aspects of the claimed subject matter. In this regard, it will also be recognized that the innovation includes a system as well as a computer-readable storage media having computer-executable instructions for performing the acts and events of the various methods of the claimed subject matter.

There are multiple ways of implementing the claimed subject matter, e.g., an appropriate API, tool kit, driver code, operating system, control, standalone or downloadable software object, etc., which enables applications and services to use the techniques described herein. The claimed subject matter contemplates the use from the standpoint of an API (or other software object), as well as from a software or hardware object that operates according to the techniques set forth herein. Thus, various implementations of the claimed subject matter described herein may have aspects that are wholly in hardware, partly in hardware and partly in software, as well as in software.

The aforementioned systems have been described with respect to interaction between several components. It can be appreciated that such systems and components can include those components or specified sub-components, some of the specified components or sub-components, and additional components, and according to various permutations and combinations of the foregoing. Sub-components can also be implemented as components communicatively coupled to other components rather than included within parent components (hierarchical).

Additionally, it can be noted that one or more components may be combined into a single component providing aggregate functionality or divided into several separate sub-components, and any one or more middle layers, such as a management layer, may be provided to communicatively couple to such sub-components in order to provide integrated functionality. Any components described herein may also interact with one or more other components not specifically described herein but generally known by those of skill in the art.

In addition, while a particular feature of the claimed subject matter may have been disclosed with respect to one of several implementations, such feature may be combined with one or more other features of the other implementations as may be desired and advantageous for any given or particular application. Furthermore, to the extent that the terms "includes," "including," "has," "contains," variants thereof, and other similar words are used in either the detailed description or the claims, these terms are intended to be inclusive in a manner similar to the term "comprising" as an open transition word without precluding any additional or other elements.

What is claimed is:

1. A method for designing three-dimensional (3D) objects for fabrication, the method comprising:
   obtaining a three-dimensional (3D) mesh comprising polygons;
   obtaining a two-dimensional (2D) image;
   receiving position information describing a position of the 2D image relative to the 3D mesh; and
   modifying the 3D mesh based on the 2D image and the position information to generate an embossed 3D mesh that is embossed with the 2D image.

2. The method of claim 1, wherein modifying the 3D mesh comprises:
   projecting the 3D mesh onto a projection surface to generate an emboss-coordinate mesh;
   generating split points of the emboss-coordinate mesh based on the 2D image;
   splitting the 3D mesh by interpolating the split points to the 3D mesh, wherein each polygon of the split 3D mesh corresponds to one of an interior of the 2D image or an exterior of the 2D image; and
   shifting polygons corresponding to the interior of the 2D image to generate the embossed 3D mesh.

3. The method of claim 2, wherein the 2D image is a bitmap image and the method comprises generating a vector outline of the bitmap image, wherein the vector outline is used to generate the split points of the emboss-coordinate mesh.

4. The method of claim 2, wherein generating split points of the emboss-coordinate mesh comprises creating a split point at any location where the vector outline of the bitmap image intersects with a polygon of the emboss-coordinate mesh.

5. The method of claim 2, wherein the projection surface is a plane and projecting the 3D mesh onto the projection surface comprises projecting vertices of the 3D mesh in a direction normal to the projection surface.

6. The method of claim 2, wherein the projection surface is a cylinder and projecting the 3D mesh onto the projection surface comprises projecting vertices of the 3D mesh in a line emanating perpendicularly from an axis of the cylinder.

7. The method of claim 2, wherein the projection surface is a sphere and projecting the 3D mesh onto the projection surface comprises projecting vertices of the 3D mesh in a line emanating from a center of the sphere.

8. The method of claim 2, comprising receiving a definition of the projection surface from a user, wherein the definition includes a projection surface type and location.

9. The method of claim 1, comprising fabricating a 3D object based on the embossed 3D mesh.

10. The method of claim 1, wherein a surface of the embossed 3D mesh corresponding to an interior of the 2D image has a same relief as a corresponding portion of the 3D mesh before being modified.

11. A system for generating a 3D model for fabrication, comprising:
a processor; and
a system memory comprising code to direct the processor to:
obtain a three-dimensional (3D) mesh comprising polygons;
obtain a two-dimensional (2D) image;
receive position information describing a position of the 2D image relative to the 3D mesh; and
modify the 3D mesh based on the 2D image and the position information to generate an embossed 3D mesh that is embossed with the 2D image.

12. The system of claim 11, wherein the code to direct the processor to modify the 3D mesh is to direct the processor to:
project the 3D mesh onto a projection surface to generate an emboss-coordinate mesh;
generate split points of the emboss-coordinate mesh based on the 2D image;
split the 3D mesh by interpolating the split points to the 3D mesh, wherein each polygon of the split 3D mesh corresponds to one of an interior of the 2D image or an exterior of the 2D image; and
shift the polygons corresponding to the interior of the 2D image to generate the embossed 3D mesh.

13. The system of claim 12, wherein the 2D image is a bitmap image, and the system memory comprises code to direct the processor to generate a vector outline of the bitmap image, wherein the vector outline is used to generate the split points of the emboss-coordinate mesh.

14. The system of claim 13, wherein to generate split points of the emboss-coordinate mesh the code is to direct the processor to create a split point at any location where the vector outline of the bitmap image intersects with a polygon of the emboss-coordinate mesh.

15. The system of claim 12, wherein the projection surface is a plane, and to project the 3D mesh onto the projection surface the code is to direct the processor to project vertices of the 3D mesh in a direction normal to the projection surface.

16. The system of claim 12, wherein the projection surface is a cylinder, and to project the 3D mesh onto the projection surface the code is to direct the processor to project vertices of the 3D mesh in a line emanating perpendicularly from an axis of the cylinder.

17. The system of claim 12, wherein the projection surface is a sphere and to project the 3D mesh onto the projection surface the processor is to project vertices of the 3D mesh in a line emanating from a center of the sphere.

18. The system of claim 12, comprising a graphical user interface (GUI) that enables a user to select a projection surface type and control placement of the projection surface relative to the 3D mesh.

19. The system of claim 11, wherein the code is to direct the processor to send the embossed 3D mesh to a 3D printer for fabricating a 3D object based on the embossed 3D mesh.

20. The system of claim 11, wherein a surface of the embossed 3D mesh corresponding to an interior of the 2D image has a same relief as a corresponding portion of the 3D mesh before being modified.

21. One or more computer-readable memory storage devices for storing computer-readable instructions that, when executed by one or more processing devices, generate an embossed 3D model, the computer-readable instructions comprising code configured to:
obtain a three-dimensional (3D) mesh comprising polygons;
obtain a two-dimensional (2D) image;
receive position information describing a position of the 2D image relative to the 3D mesh; and
modify the 3D mesh based on the 2D image and the position information to generate an embossed 3D mesh that is embossed with the 2D image.

22. The memory storage device of claim 21, wherein the code configured to modify the 3D mesh is configured to:
project the 3D mesh onto a projection surface to generate an emboss-coordinate mesh;
generate split points of the emboss-coordinate mesh based on the 2D image;
split the 3D mesh by interpolating the split points to the 3D mesh, wherein each polygon of the split 3D mesh corresponds to one of an interior of the 2D image or an exterior of the 2D image; and
shift the polygons corresponding to the interior of the 2D image to generate the embossed 3D mesh.

23. The memory storage device of claim 22, wherein the 2D image is a bitmap image and the computer-readable instructions comprise code configured to generate a vector outline of the bitmap image, wherein the vector outline is used to generate the split points of the emboss-coordinate mesh.

24. The memory storage device of claim 23, wherein the code configured to generate split points of the emboss-coordinate mesh is configured to create a split point at any location where the vector outline of the bitmap image intersects with a polygon of the emboss-coordinate mesh.

25. The memory storage device of claim 22, comprising code configured to provide a graphical user interface (GUI) that enables a user to select a projection surface type and control placement of the projection surface relative to the 3D mesh.

26. The memory storage device of claim 21, wherein a surface of the embossed 3D mesh corresponding to an interior of the 2D image has a same relief as a corresponding portion of the 3D mesh before being modified.

* * * * *